(12) United States Patent
Chiu et al.

(10) Patent No.: US 11,835,553 B2
(45) Date of Patent: Dec. 5, 2023

(54) ZERO-CROSSING DETECTION CIRCUIT

(71) Applicant: Hangzhou Lianxintong Semiconductor Co., Ltd., Hangzhou (CN)

(72) Inventors: Li-Yu Chiu, Hangzhou (CN); Hsin-Hsien Li, Hangzhou (CN)

(73) Assignee: Hangzhou Lianxintong Semiconductor Co., Ltd., Hangzhou (CN)

( * ) Notice: Subject to any disclaimer, the term of this patent is extended or adjusted under 35 U.S.C. 154(b) by 0 days.

(21) Appl. No.: 17/703,485

(22) Filed: Mar. 24, 2022

(65) Prior Publication Data

US 2023/0194578 A1    Jun. 22, 2023

(30) Foreign Application Priority Data

Dec. 22, 2021   (CN) .......................... 202111582141.5

(51) Int. Cl.

| | | |
|---|---|---|
| *G01R 27/02* | (2006.01) | |
| *G01R 19/175* | (2006.01) | |
| *H03K 5/1536* | (2006.01) | |
| *H02M 1/08* | (2006.01) | |
| *H02M 7/06* | (2006.01) | |

(52) U.S. Cl.
CPC .......... *G01R 19/175* (2013.01); *H02M 1/083* (2013.01); *H03K 5/1536* (2013.01); *H02M 7/06* (2013.01)

(58) Field of Classification Search
CPC ....... G01R 19/175; G01R 1/28; H02M 1/083; H02M 7/06; H03K 5/1536
See application file for complete search history.

(56) References Cited

U.S. PATENT DOCUMENTS

| | | | | |
|---|---|---|---|---|
| 4,229,669 | A | 10/1980 | Smith | |
| 8,115,517 | B2 * | 2/2012 | Hallak | .................. H02M 1/083 |
| | | | | 327/79 |
| 10,873,326 | B1 * | 12/2020 | Sabde | ....................... G06G 7/14 |
| 2011/0102052 | A1 | 5/2011 | Billingsley | |

(Continued)

FOREIGN PATENT DOCUMENTS

| | | | |
|---|---|---|---|
| CN | 102890184 A | | 1/2013 |
| CN | 103036593 | * | 4/2013 |

(Continued)

OTHER PUBLICATIONS

Chinese Application CN2021115821415, Office Action, dated May 7, 2023.

(Continued)

*Primary Examiner* — Thang X Le
(74) *Attorney, Agent, or Firm* — David R. Stevens; Stevens Law Group

(57) ABSTRACT

The present disclosure discloses a zero-crossing detection circuit, including: a zero-crossing judgment module, having a first end and a second end, wherein the first end is connected to a power supply and the second end is grounded; a photoelectric coupler, connected to the zero-crossing judgment module; an optocoupler driving module, connected to the photoelectric coupler; and an energy storage capacitor, wherein the energy storage capacitor is configured to provide excitation power for the photoelectric coupler and the optocoupler driving module.

8 Claims, 3 Drawing Sheets

(56) References Cited

U.S. PATENT DOCUMENTS

2014/0028354 A1* 1/2014 Yao .................. G01R 19/175
327/79
2014/0132246 A1* 5/2014 Schwind ............ G01R 25/00
324/76.82

FOREIGN PATENT DOCUMENTS

| CN | 204065223 U | | 12/2014 |
|---|---|---|---|
| CN | 106374508 A | | 2/2017 |
| CN | 106501587 A | | 3/2017 |
| CN | 106980039 A | | 7/2017 |
| CN | 207516436 U | | 6/2018 |
| CN | 207528810 U | | 6/2018 |
| CN | 207675825 U | | 7/2018 |
| CN | 109459607 A | | 3/2019 |
| CN | 109568788 A | | 4/2019 |
| CN | 210572481 U | | 5/2020 |
| CN | 111384780 A | | 7/2020 |
| CN | 111596123 A | | 8/2020 |
| CN | 212364414 | * | 1/2021 |
| CN | 212364414 U | | 1/2021 |
| CN | 212905128 U | | 4/2021 |

OTHER PUBLICATIONS

European Application 22 162 052.9, Office Action, dated Sep. 28, 2022.

* cited by examiner

ZERO-CROSSING DETECTION CIRCUIT

CROSS-REFERENCE TO RELATED APPLICATION

The present disclosure claims priority of Chinese patent application with the filing number 2021115821415 filed on Dec. 22, 2021 with the Chinese Patent Office, and entitled "Zero-crossing Detection Circuit", the contents of which are incorporated herein by reference in entirety.

TECHNICAL FIELD

The present disclosure relates to the technical field of circuits, and particularly to a zero-crossing detection circuit.

BACKGROUND ART

The zero-crossing detection circuit is commonly used under an alternating current system, and its detection result indicates the exact instant in which the input alternating current signal transitions from positive semi-cycle to negative semi-cycle and crosses the zero position. Since the synchronization requirement is high in carrier data transmission system, the accuracy of zero-crossing detection is also highly required.

In the common zero-crossing detection circuits on the current market, the conduction of the optocoupler is controlled by an operation current of a switch control unit connected thereto, and an energy storage capacitor with a relatively large capacitance value is often required, which not only takes a relatively large amount of time to charge that energy storage capacitor, but also consumes quite a lot of power.

SUMMARY

An objective of the present disclosure lies in providing a zero-crossing detection circuit, which is more power-saving and has high efficiency.

In a first aspect, an embodiment of the present disclosure provides a zero-crossing detection circuit, including:

a zero-crossing judgment module, having a first end and a second end, wherein the first end is connected to a power supply and the second end is grounded;

a photoelectric coupler, connected to the zero-crossing judgment module;

an optocoupler driving module (photoelectric coupler driving module), connected to the photoelectric coupler; and an energy storage capacitor, wherein the energy storage capacitor is configured to provide excitation power for the photoelectric coupler and the optocoupler driving module.

In an embodiment, a rectification circuit is further included, and connected to the energy storage capacitor.

In an embodiment, a first current-limiting resistor has two ends connected to the optocoupler driving module and a first interface of the power supply respectively;

a second current-limiting resistor has two ends connected to the optocoupler driving module and a second interface of the power supply respectively;

a third current-limiting resistor has two ends connected to the rectification circuit and the second interface of the power supply respectively; and a fourth current-limiting resistor has two ends connected to the rectification circuit and the first interface of the power supply respectively.

In an embodiment, the optocoupler driving module is a first transistor, and the first transistor has a first end connected to the photoelectric coupler, a second end connected to the energy storage capacitor, and a third end configured to input a control signal.

In an embodiment, a first voltage clamp module is further included, and connected to the energy storage capacitor in parallel.

In an embodiment, the zero-crossing judgment module includes:

a second transistor, wherein the second transistor has a first end connected to the first resistor, a second end connected to the photoelectric coupler and the power supply respectively, and a third end connected to a second resistor.

In an embodiment, a rectification module is further included, and connected to the optocoupler driving module.

In an embodiment, a second voltage clamp module is further included, wherein the second voltage clamp module is connected to the optocoupler driving module.

In an embodiment, it includes: a first diode connected to a first end of the first voltage clamp module; and a second diode connected to a second end of the first voltage clamp module.

In an embodiment, the zero-crossing judgment module includes:

a third transistor, wherein the third transistor has a first end connected to a third resistor, a second end grounded, and a third end connected to the photoelectric coupler and a fourth resistor respectively The technical solutions provided in the above embodiments of the present disclosure reduces the conduction interval of the photoelectric coupler in the circuit, not only reducing the average power consumption of the circuit and prolonging the service life of the circuit components, but also enabling high zero-crossing detection accuracy.

BRIEF DESCRIPTION OF DRAWINGS

In order to more clearly illustrate technical solutions of embodiments of the present disclosure, accompanying drawings which need to be used in the embodiments will be introduced briefly below.

DETAILED DESCRIPTION OF EMBODIMENTS

In the description of the present disclosure, terms such as "first" and "second" are merely for distinguishing the description, but do not indicate sequence numbers, nor can they be construed as indicating or implying importance in the relativity.

In the description of the present disclosure, the terms "include", "contain", etc. means existence of the feature, integer, step, operation, element and/or component, but does not exclude existence or addition of one or more other features, steps, operations, elements, components and/or collections thereof.

Unless otherwise defined, all of the technical and scientific terms used herein have the same meanings as those generally understood by a person skilled in the art of the present disclosure. Terms used herein in the description of the present disclosure are only for the purpose of describing specific embodiments, rather than limiting the present disclosure.

Technical solutions of the present disclosure will be described below clearly and completely in combination with accompanying drawings.

Figure 1:
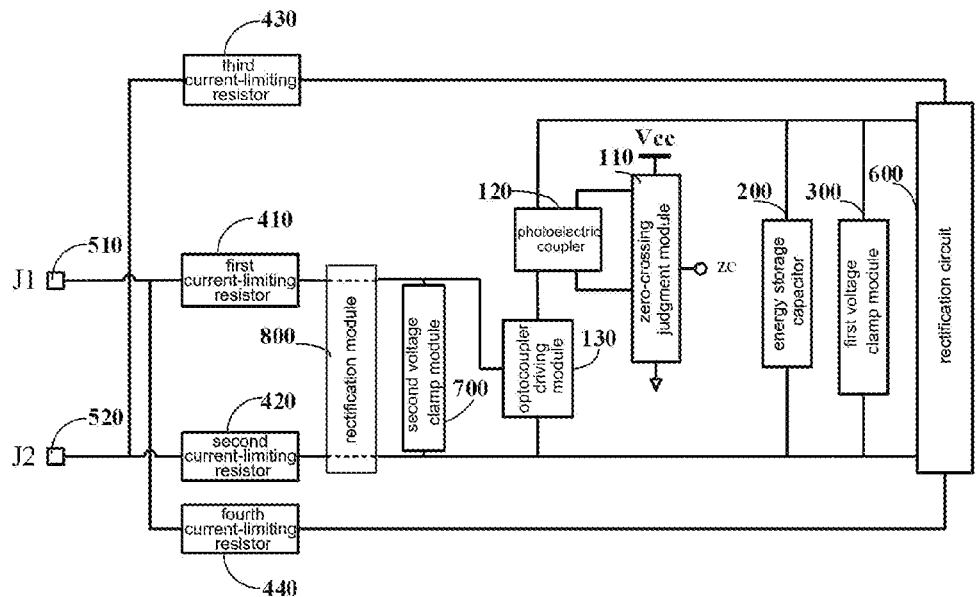
FIG. 1 is a schematic view of a framework of a zero-crossing detection circuit provided in an embodiment of the present disclosure.

Referring to FIG. 1, it is a schematic view of a framework of a zero-crossing detection circuit provided in an embodiment of the present disclosure, including a zero-crossing judgment module 110, a photoelectric coupler 120, an optocoupler driving module 130, and an energy storage capacitor 200. The zero-crossing judgment module 110 has a first end connected to a power supply Vcc, a second end grounded, and a third end and a fourth end connected to the photoelectric coupler 120.

The zero-crossing judgment module 110 includes a zero-crossing output signal ZC. When the input alternating current changes from a negative potential to a positive potential or from a positive potential to a negative potential, the output signal of the zero-crossing output signal ZC will change.

The photoelectric coupler 120 includes a light emitting source and a light receiver, wherein the light emitting source may be a light-emitting diode, and the light receiver may be a photosensitive diode, a photosensitive transistor, and so on. The input electrical signal drives the light emitting source, to enable the light emitting source to emit light of a certain wavelength, to thereby generate a photocurrent, the photocurrent is then further amplified by the light receiver and output, thus completing the conversion of electricity-light-electricity.

The optocoupler driving module 130 is connected to the photoelectric coupler 120 and the energy storage capacitor 200, and the optocoupler driving module 130 can function as a control switch.

The energy storage capacitor 200 can provide excitation power for the photoelectric coupler 120 and the optocoupler driving module 130.

The zero-crossing detection circuit has a first interface 510 and a second interface 520 to the power supply, wherein the first interface 510 and the second interface 520 may be a live wire and a neutral wire respectively, or the first interface 510 is a neutral wire, and the second interface 520 is a live wire.

The zero-crossing detection circuit may include a first voltage clamp module 300, a rectification circuit 600, a first current-limiting resistor 410, a second current-limiting resistor 420, a third current-limiting resistor 430, and a fourth current-limiting resistor 440. The first voltage clamp module 300 may be a Zener diode, connected to the energy storage capacitor 200 in parallel, and mainly used for limiting a highest charging voltage of the energy storage capacitor 200 when the energy storage capacitor is charged. The rectification circuit 600 is connected to the energy storage capacitor 200 and the first voltage clamp module 300.

The current-limiting resistors are configured to protect the circuit and reduce power consumption of the circuit. Two ends of the first current-limiting resistor 410 are connected to the optocoupler driving module 130 and the first interface 510, respectively; two ends of the second current-limiting resistor 420 are connected to the optocoupler driving module 130 and the second interface 520, respectively; two ends of the third current-limiting resistor 430 are connected to the rectification circuit 600 and the second interface 520, respectively; and two ends of the fourth current-limiting resistor 440 are connected to the rectification circuit 600 and the first interface 510, respectively.

The first interface 510 is connected to a control end of the optocoupler driving module 130 through the first current-limiting resistor 410, and an end of the optocoupler driving module 130 is connected to the second current-limiting resistor 420, and to the second interface 520 via current limitation of the second current-limiting resistor 420. A rectification module 800 can be selectively added to a return path between the first current-limiting resistor 410 and the second current-limiting resistor 420 so as to save power to the greatest extent, and a second voltage clamp module 700 may also be connected in parallel to protect the optocoupler driving module 130.

The first interface 510 and the second interface 520 can form an energy storage power supply loop, with the energy storage capacitor 200, the first voltage clamp module 300, and the rectification circuit 600. The third current-limiting resistor 430 and the fourth current-limiting resistor 440 are connected to the first end and the second end of the rectification circuit 600, respectively. The energy storage capacitor 200 and the first voltage clamp module 300 are connected in parallel between a third end and a fourth end of the rectification circuit 600, and the optocoupler driving module 130 and the photoelectric coupler 120 are meanwhile connected therebetween.

In a charging phase of the energy storage capacitor 200, when an input signal of the alternating current of the second interface 520 is positive, and the input signal of the first interface 510 is negative, the energy storage power supply loop is ON, and the alternating current supplies power to the energy storage capacitor 200 through rectification of the rectification circuit 600. Since the energy storage capacitor 200 is connected in parallel with the first voltage clamp module 300, the first voltage clamp module 300 can limit the highest voltage of the energy storage capacitor 200. A cross voltage is formed between a control end and the second end of the optocoupler driving module 130, and is limited to a negative potential, therefore, the series circuit where the optocoupler driving module 130 and the photoelectric coupler 120 are located is not conductive (i.e. being OFF), and the charging process of the energy storage capacitor 200 is not affected.

When the alternating current signal inputted to the second interface 520 gradually turns to a negative voltage, the signal of the first interface 510 becomes a positive voltage, the cross voltage between the control end and the second end of the optocoupler driving module 130 changes and turns to be positive, and the optocoupler driving module 130 is therefore turned on. The energy storage capacitor 200 supplies power to the optocoupler driving module 130 and a light emitter in the photoelectric coupler 120. The photoelectric coupler 120 outputs an excitation current to the zero-crossing judgment module 110, so that the zero-crossing output signal ZC in the zero-crossing judgment module changes.

As the energy storage capacitor 200 adopted in the present embodiment has a smaller capacitance value, when the photoelectric coupler 120 draws the electrical energy stored in the energy storage capacitor 200, the cross voltage of the energy storage capacitor 200 drops rapidly, until power supplying to the photoelectric coupler 120 terminates.

Therefore, the ON duration of the photoelectric coupler 120 is short, and the ON duration is determined by the capacitance value of the energy storage capacitor 200 and the amount of electric power drawn by the optocoupler driving module 130.

During the ON or OFF period of the photoelectric coupler 120, the zero-crossing output signal ZC in the zero-crossing judgment module 110 will output a correct signal accordingly.

Figure 2:
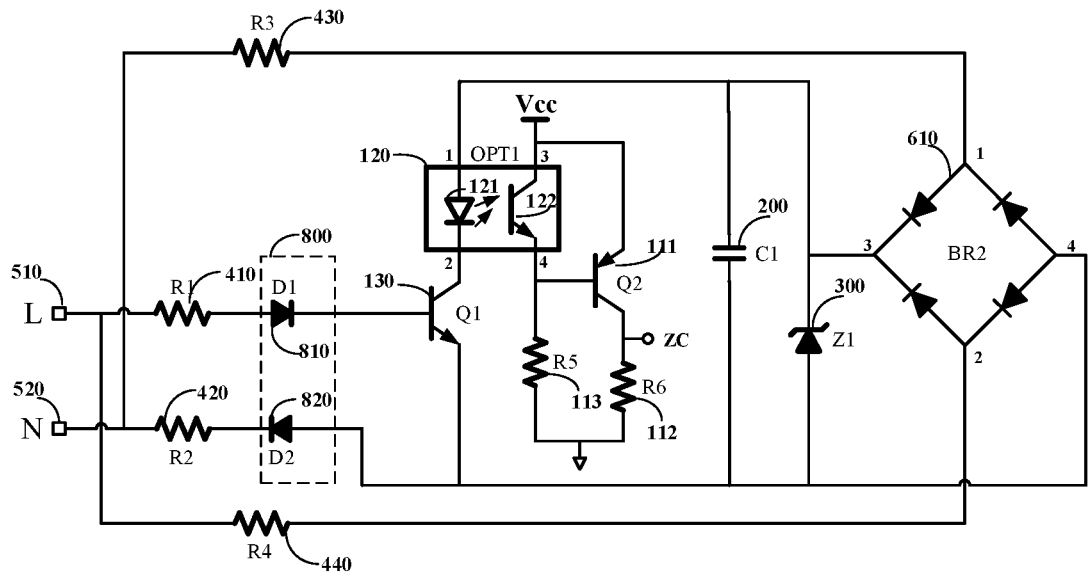
FIG. 2 is a structural schematic view of a zero-crossing detection circuit provided in an embodiment of the present disclosure.

Referring to FIG. 2, it is a structural schematic view of a zero-crossing detection circuit provided in an embodiment of the present disclosure, in which a rectification module 800 is further included, wherein the rectification module 800 includes a diode 810 and a diode 820. The rectification module 800 is connected to the control end and the second end of the optocoupler driving module 130. The rectification circuit may be a bridge rectifier 610, and the bridge rectifier 610 is composed of four diodes. The first voltage clamp module 300 may be a Zener diode 300.

The zero-crossing judgment module 110 includes a second transistor 111, a first resistor 112, and a second resistor 113. The second transistor has a first end connected to the first resistor 112, a second end connected to the photoelectric coupler 120 and the power supply respectively, and a third end connected to the second resistor 113. The second transistor may be a PNP transistor 111, and the PNP transistor 111 has a first end that is a collector, connected to the first resistor 111; a second end that is an emitter, connected to the third end of the photoelectric coupler 120 and the power supply Vcc, respectively; and a third end that is a base, connected to the second resistor 113 and a fourth end of the photoelectric coupler 120.

The photoelectric coupler 120 includes a light-emitting diode 121 and a photosensitive transistor 122, a positive electrode of the light-emitting diode 121 is a first end of the photoelectric coupler 120, and a negative electrode of the light-emitting diode 121 is a second end of the photoelectric coupler 120. An end of the photosensitive transistor 122 is the third end of the photoelectric coupler 120, and a second end of the photosensitive transistor 122 is the fourth end of the photoelectric coupler 120.

The optocoupler driving module 130 is a first transistor, and the first transistor has a first end connected to the photoelectric coupler 120, a second end connected to the energy storage capacitor 200, and a third end configured to input a control signal.

In an embodiment, the first transistor 130 may be an NPN transistor 130, wherein a first end is a collector of the NPN transistor 130, and connected to the second end of the photoelectric coupler 120; a second end is an emitter, and connected to the energy storage capacitor 200, a positive electrode of a Zener diode 300, and a fourth end of the full-wave rectifier; and the third end is a base, and connected to the first interface 510 via the diode 810 and the first current-limiting resistor 410 for inputting a control signal.

The first interface 510 of the circuit shown in FIG. 2 is a live wire, and the second interface 520 is a neutral wire. A first end of the full-wave rectifier 610 is connected to the second interface 520 via a third current-limiting resistor 430, and a second end of the full-wave rectifier 610 is connected to the first interface 510 via a fourth current-limiting resistor 440.

A negative electrode of the Zener diode 300 is connected to a third end of the full-wave rectifier 610, and a positive electrode thereof is connected to a fourth end of the full-wave rectifier 610 and the diode 820. The energy storage capacitor 200 is connected to the Zener diode 300 in parallel.

When the signal voltage of the first interface 510 is negative relative to the signal voltage of the second interface 520, the alternating current, passing through the third current-limiting resistor 430, arrives at the first end of the full-wave rectifier 610, and after being rectified by the full-wave rectifier 610, is output from the third end of the full-wave rectifier and charges the energy storage capacitor 200. The highest voltage of the energy storage capacitor 200 is limited by the Zener diode 300, for protecting the photoelectric coupler 120 and the NPN transistor 130 in the power charging phase. The signal waveform of the second interface 520 is as shown by waveform a of FIG. 3. The signal of the energy storage capacitor 200 is as shown by waveform b of FIG. 3. The current is input to the fourth end of the full-wave rectifier 610, and output from the second end, and flows through the fourth current-limiting resistor 440 to the first interface 510.

Figure 3:
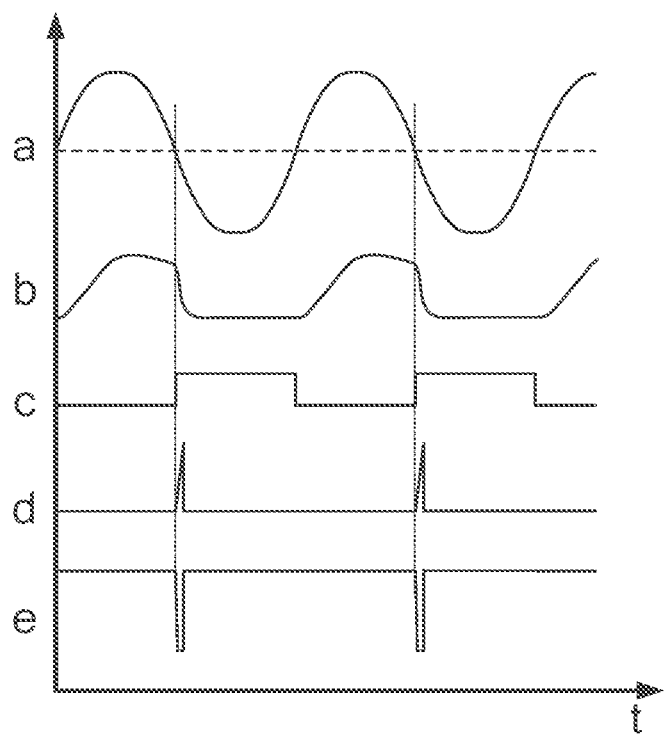
FIG. 3 is a waveform diagram related to the circuit shown in FIG. 2.

During the charging phase of the energy storage capacitor 200, since the cross voltage between the base and the emitter of the NPN transistor 130 are limited to be negative, the diode D1 is reverse-biased off, the NPN transistor 130 is not ON, there is no current flowing into or out of the photoelectric coupler 120, the base of the PNP transistor 111 is connected by the second resistor 113 to a low potential, the zero-crossing output signal ZC is maintained at the potential of the power supply Vcc, and the zero-crossing output signal ZC is as shown by waveform e of FIG. 3.

When the signal of the second interface 520 changes to a negative voltage, the potential of the first interface 510 rises to a positive voltage, the diode 810 and the diode 820 turn to a forward-biased ON state, the NPN transistor 130 is conductive with the light-emitting diode 121 in the photoelectric coupler 120, to draw a current from the energy storage capacitor 200 to excite and drive the third end in the photoelectric coupler 120 to introduce the current from the power supply Vcc, the base of the PNP transistor 111 is connected to a high level and then is turned off, and the zero-crossing output signal ZC connected to the collector is pulled to a low potential.

The waveform c of FIG. 3 represents the cross voltage between the base and the emitter of the NPN transistor, and the waveform d represents the on-state current flowing through the NPN transistor 130 and the light-emitting diode 121 in the photoelectric coupler 120.

Since the energy storage capacitor 200 has a smaller capacitance value and is under a condition of being subjected to rapid current drawing, the cross voltage rapidly drops until the charge in energy storage capacitor 200 is depleted, and then the photoelectric coupler 120 and the NPN transistor 130 turn off, the base of the PNP transistor 111 is pulled to a low potential and then turns on, and the zero-crossing output signal ZC returns to a high potential.

In this embodiment of the present disclosure, the photoelectric coupler has a larger current passing therethrough only in a short period of time, and remains in the off state in the remaining period of one alternating current cycle, which not only can save the electric energy of the zero-crossing detection circuit, but also can prolong the service life of the circuit.

Figure 4:
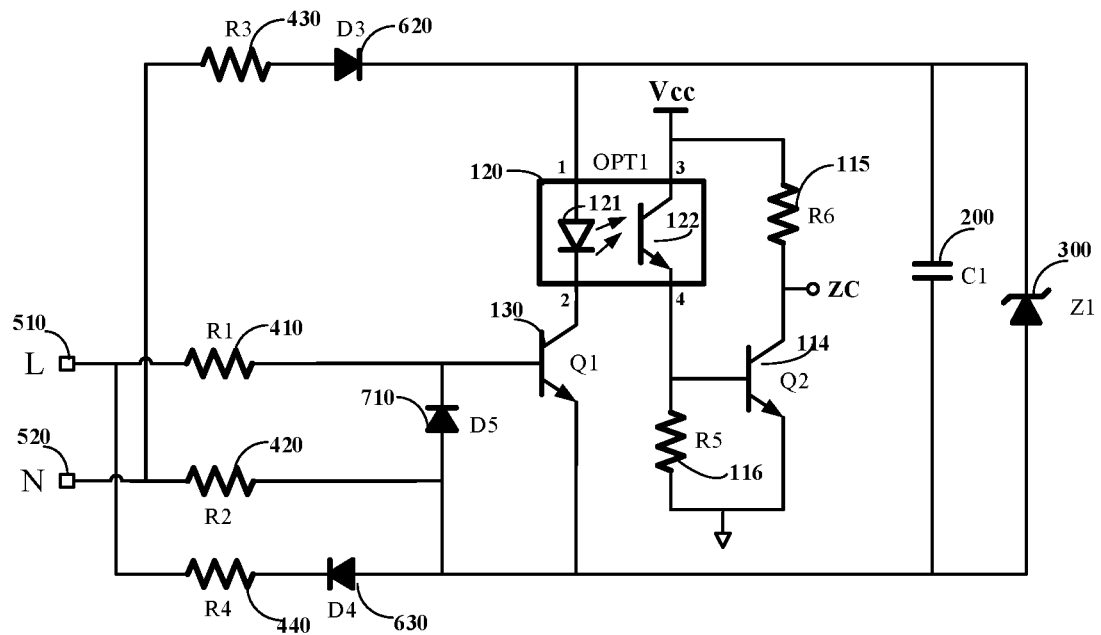
FIG. 4 is a structural schematic view of another zero-crossing detection circuit provided in an embodiment of the present disclosure.

Referring to FIG. 4, it is a structural schematic view of another zero-crossing detection circuit provided in an embodiment of the present disclosure. The zero-crossing detection circuit further includes a second voltage clamp module 700, a first diode 620, and a second diode 630. The second voltage clamp module 700 includes a diode 710.

The zero-crossing judgment module 110 includes a third transistor 114, a third resistor 115, and a fourth resistor 116.

The third transistor has a first end connected to the third resistor 115, a second end grounded, and a third end respectively connected to the photoelectric coupler 120 and the fourth resistor 116. The third transistor 114 may be an NPN transistor 114, wherein a first end of the NPN transistor 114 is a collector, and a connection point between the first end and the third resistor 115 is a zero-crossing output signal ZC; a second end thereof is an emitter; and a third end is a base, and connected to the fourth resistor 116 and the fourth end of the photoelectric coupler 120.

The photoelectric coupler 120 includes a light-emitting diode 121 and a photosensitive transistor 122, a positive electrode of the light-emitting diode 121 is a first end of the photoelectric coupler 120, and a negative electrode of the light-emitting diode 121 is a second end of the photoelectric coupler 120. A first end of the photosensitive transistor 122 is the third end of the photoelectric coupler 120, and a second end of the photosensitive transistor 122 is the fourth end of the photoelectric coupler 120.

The optocoupler driving module 130 is a first transistor 130, and the first transistor 130 has a first end connected to the photoelectric coupler 120, a second end connected to the energy storage capacitor 200, and a third end configured to input a control signal. The first transistor 130 may be an NPN transistor 130, the first end is a collector of the NPN transistor 130, and connected to the second end of the photoelectric coupler 120; the second end is an emitter, and connected to the energy storage capacitor 200, the positive electrode of the Zener diode 300, and the positive electrode of the second diode 630; and the third end is a base, and connected to the first interface 510 via the first current-limiting resistor 410, for inputting a control signal.

One end of the first current-limiting resistor 410 is connected to the first interface 510, and the other end thereof is connected to the base of the NPN transistor 130 and the negative electrode of the diode 710. One end of the second current-limiting resistor 420 is connected to the second interface 520, and the other end thereof is connected to the positive electrode of the diode 710. One end of the third current-limiting resistor 430 is connected to the second interface 520, and the other end thereof is connected to the positive electrode of the first diode 620. One end of the fourth current-limiting resistor 440 is connected to the first interface 510, and the other end thereof is connected to the negative electrode of the second diode 630.

When the signal voltage of the first interface 510 is negative relative to the signal voltage of the second interface 520, the alternating current charges the energy storage capacitor 200 through the third current-limiting resistor 430 and the first diode 620. The highest voltage of the energy storage capacitor 200 is limited by the Zener diode 300, for protecting the photoelectric coupler 120 and the NPN transistor 130 during the power charging phase. The signal waveform of the second interface 520 is shown by waveform a of FIG. 5, and the signal of the energy storage capacitor 200 is shown by waveform b of FIG. 5. Current flows through the second diode 630 and the fourth current-limiting resistor 440 to the first interface 510.

In the charging phase of the energy storage capacitor 200, the cross voltage between the base and the emitter of the NPN transistor 130 are limited to negative, the NPN transistor 130 is not conductive (i.e. being OFF), no current flows into or out of the photoelectric coupler 120, and the zero-crossing output signal ZC is maintained at the potential of the power supply Vcc. The zero-crossing output signal ZC is as shown by waveform e of FIG. 5.

When the signal of the second interface 520 turns to a negative voltage, the potential of the first interface 510 rises and turns to a positive voltage, the NPN transistor 130 is conductive with the light-emitting diode 121 in the photoelectric coupler 120, and a current is quickly drawn from the energy storage capacitor 200 to excite and drive the third end in the photoelectric coupler 120 to introduce the current from the power supply Vcc, and the zero-crossing output signal ZC connected to the collector of the third transistor 114 is pulled to a low potential.

Figure 5:
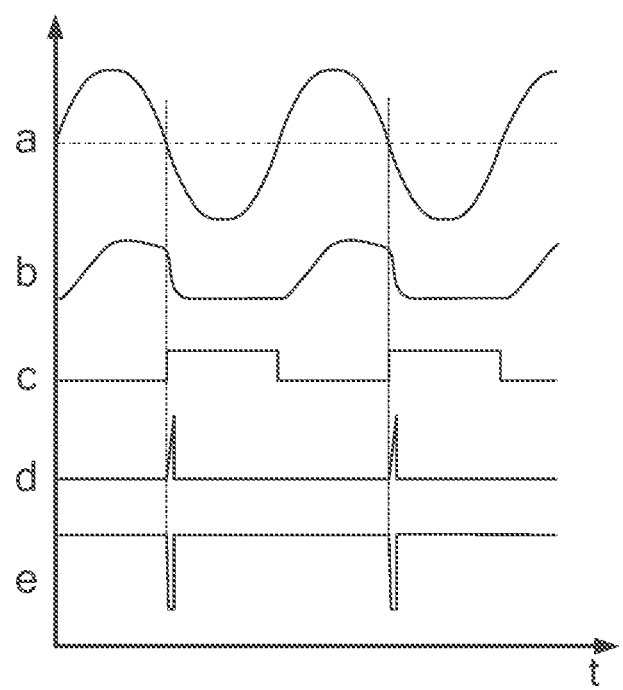
FIG. 5 is a waveform diagram related to the circuit shown in FIG. 4.

The waveform c of FIG. 5 represents the cross voltage between the base and the emitter of the NPN transistor 130, and the waveform d is representation of an on-state current flowing through the NPN transistor 130 and the light-emitting diode 121 in the photoelectric coupler 120.

As the energy storage capacitor 200 has a smaller capacitance value and is under a condition of being subjected to rapid current drawing, the cross voltage rapidly drops until the charge of energy storage capacitor 200 is depleted and then the photoelectric coupler 120 and the NPN transistor 130 turn off, and the zero-crossing output signal ZC returns to a high potential.

The circuit shown in FIG. 4 uses the third transistor 114 and the third resistor 115 to form an inverse gain stage, and can react to a weaker on-state current of the photoelectric coupler 120.

In the several embodiments provided in the present disclosure, the circuit and the method disclosed also can be implemented in other modes. The apparatus embodiments described above are merely exemplary, for example, the flowcharts and the block diagrams in the accompanying drawings illustrate possible system architectures, functions, and operations of the apparatus, method, and computer program products according to multiple embodiments of the present disclosure. In this regard, each block in the flowcharts or the block diagrams may represent a part of a module, program segment or code, and the part of the module, program segment, or code contains one or more executable instructions configured to achieve a specified logical function. In some alternative implementations, functions marked in the blocks also can occur in an order different from that marked in the accompanying drawings. For example, two continuous blocks practically can be executed substantially in parallel, and they sometimes also may be executed in a reverse order, which depends upon a function involved. It also should be noted that each block in the block diagram and/or flowchart, and combinations of the blocks in the block diagram and/or the flowchart can be realized by a dedicated hardware-based system configured to execute a specified function or action, or can be realized by a combination of dedicated hardware and computer instructions.

Besides, the various functional modules in various embodiments of the present disclosure can be integrated together to form one independent portion, and it is also possible that the various modules exist independently, or that two or more modules are integrated to form one independent part.

The above are merely for preferred embodiments of the present disclosure and not used to limit the present disclosure. For one skilled in the art, various modifications and changes may be made to the present disclosure. Any modifications, equivalent substitutions, improvements and so on, within the spirit and principle of the present disclosure, should be covered within the scope of protection of the present disclosure.

What is claimed is:

1. A zero-crossing detection circuit, comprising:
a zero-crossing judgment module having a first end and a second end, wherein the first end is connected to a power supply, and the second end is grounded;
a photoelectric coupler connected to the zero-crossing judgment module;
an optocoupler driving module connected to the photoelectric coupler;
an energy storage capacitor, wherein the energy storage capacitor is configured to provide excitation power for the photoelectric coupler and the optocoupler driving module;
a rectification circuit connected to the energy storage capacitor;
a first current-limiting resistor having two ends connected to the optocoupler driving module and a first interface of the power supply respectively;
a second current-limiting resistor having two ends connected to the optocoupler driving module and a second interface of the power supply respectively;
a third current-limiting resistor having two ends connected to the rectification circuit and the second interface of the power supply respectively; and
a fourth current-limiting resistor having two ends connected to the rectification circuit and the first interface of the power supply respectively.

2. The zero-crossing detection circuit according to claim 1, wherein the optocoupler driving module is a first transistor, and the first transistor has a first end connected to the photoelectric coupler, a second end connected to the energy storage capacitor, and a third end configured to input a control signal.

3. The zero-crossing detection circuit according to claim 1, further comprising:
a first voltage clamp module connected to the energy storage capacitor in parallel.

4. The zero-crossing detection circuit according to claim 1, wherein the zero-crossing judgment module comprises:
a second transistor wherein the second transistor has a first end connected to a first resistor, a second end respectively connected to the photoelectric coupler and the power supply, and a third end connected to a second resistor.

5. The zero-crossing detection circuit according to claim 4, further comprising:
a rectification module connected to the optocoupler driving module.

6. The zero-crossing detection circuit according to claim 1, further comprising a second voltage clamp module, wherein the second voltage clamp module is connected to the optocoupler driving module.

7. The zero-crossing detection circuit according to claim 6, further comprising:
a first diode connected to a first end of the first voltage clamp module; and
a second diode connected to a second end of the first voltage clamp module.

8. The zero-crossing detection circuit according to claim 6, wherein the zero-crossing judgment module comprises:
a third transistor wherein the third transistor has a first end connected to a third resistor, a second end grounded, and a third end respectively connected to the photoelectric coupler and a fourth resistor.

* * * * *